United States Patent [19]

Fukuzo

[11] Patent Number: 4,641,049
[45] Date of Patent: Feb. 3, 1987

[54] TIMING SIGNAL GENERATOR
[75] Inventor: Yukio Fukuzo, Tokyo, Japan
[73] Assignee: NEC Corporation, Tokyo, Japan
[21] Appl. No.: 669,979
[22] Filed: Nov. 9, 1984
[30] Foreign Application Priority Data
Nov. 11, 1983 [JP] Japan .................................. 58-211791
[51] Int. Cl.$^4$ ........................ H03K 5/13; H03K 17/28
[52] U.S. Cl. .................................. 307/590; 307/594; 307/596; 307/602
[58] Field of Search ............... 307/590, 594, 596, 600, 307/602, 269

[56] References Cited
U.S. PATENT DOCUMENTS
4,433,252 2/1984 Lewis .................................. 307/602
4,479,067 10/1984 Fujita .................................. 307/475
4,496,861 1/1985 Bazes .................................. 307/602

Primary Examiner—Stanley D. Miller
Assistant Examiner—B P. Davis
Attorney, Agent, or Firm—Sughrue, Mion, Zinn, Macpeak & Seas

[57] ABSTRACT

A timing signal generator which can operate stably even when, or directly after, a power supply is switched on. The generator is of the type having a first dynamic delay circuit for generating a first timing signal in response to said input control signal and a second dynamic delay circuit for generating a second timing signal in response to the first timing signal, and is featured by a first transistor connected between the output of the first dynamic delay circuit and a voltage terminal with a gate connected to the input of the first dynamic delay circuit and a second transistor connected to the output of the second dynamic delay circuit and the voltage terminal with a gate connected to receive the first timing signal.

17 Claims, 8 Drawing Figures

TIMING SIGNAL GENERATOR

BACKGROUND OF THE INVENTION

The present invention relates to a timing signal generator and more particularly to one suitable for a dynamic memory (DRAM).

Dynamic memories have been utilized in various fields due to their large memory capacities. Dynamic memories operate under control of a basic, externally generated control signal. One of the important functions of the basic control signal is to control memory reset operations.

In dynamic logic circuits, prior to any logic operation, circuit nodes are reset to establish the standby mode. In the standby mode, the circuit is made ready for the subsequent logic operation. In dynamic memories, a plurality of dynamic type functional blocks such as address buffers and address decoders are subjected to reset operations in predetermined timing sequences. For example, the address buffers are reset first to set the outputs therefrom at a low level and then NOR output nodes of the address decoders are reset to a high precharged level. By keeping the sequence of resets of the respective functional blocks in a predetermined order, the respective functional blocks can operate adequately, without malfunction, and at maximum speed when the memory is shifted to a read-out or write operation. In order to achieve the above sequence of reset operations for the functional blocks, a timing signal generator is employed in the memory. The timing signal generator generates a sequence of timing signals which control the reset operations of the respective blocks in response to a basic signal. However, the above sequence of reset operations is not maintained when, or directly after, a power supply to a memory is switched on, to shift the memory from a non-powered state to a powered state. In this instance, potential states of circuit nodes in the respective functional blocks are likely to be indefinite and unstable. Therefore, such circuit nodes are subjected to an initializing operation in order to set the circuit nodes at predetermined states. Namely, circuit conditions of the functional blocks must be set at predetermined initial states directly after the power voltage is turned on. Otherwise, the circuit operation will become incomplete and an abnormally large current is generated in the circuit. Such abnormal current sometimes causes the circuit to break down or do harm to other elements of the system or circuit board.

In the initializing operation, a plurality of timing signals generated from a timing signal generator employed in a memory are also required to occur in a predetermined order.

However, it has been difficult to achieve proper initializing operations when circuit node potentials are in the unstable state for the conventional timing signal generators may cause a timing abnormality in signal timing when, or immediately after, the power is switched on.

SUMMARY OF THE INVENTION

It is an object of the present invention to present a timing signal generator which can generate a plurality of timing signals in a desired order even when power supply is switched on.

It is another object of the present invention to provide a timing signal generator suitable for dynamic memories.

The timing signal generator according to the present invention is of the type comprising a first delay circuit adapted to generate a first timing signal in response to an input control signal and a second delay circuit for generating a second timing signal in response to the first timing signal. The timing signal generator of the invention further comprises a first field effect transistor connected to the output terminal of the first delay circuit so as to supply it with a power voltage when the input control signal becomes high and a second field effect transistor connected to the output terminal of the second delay circuit so as to supply it with the power voltage when the first timing signal becomes high.

According to the present invention, when the power supply is switched on, the first transistor becomes conducting first in response to the input control signal so that the first timing signal is generated. Then, in response to the generation of the first timing signal, the second transistor becomes conducting so that the second timing signal is generated. Thus, the first and second timing signals are generated in a desired order even when the power supply is switched on.

The timing signal generator of the invention is useful not only for dynamic memories but also for dynamic logic circuits.

DETAILED DESCRIPTION OF THE INVENTION

In the following explanation, N-channel MOS transistors are employed as transistors, and a power voltage $V_{cc}$ serves as a high level while ground potential serves as a low level.

Figure 1:
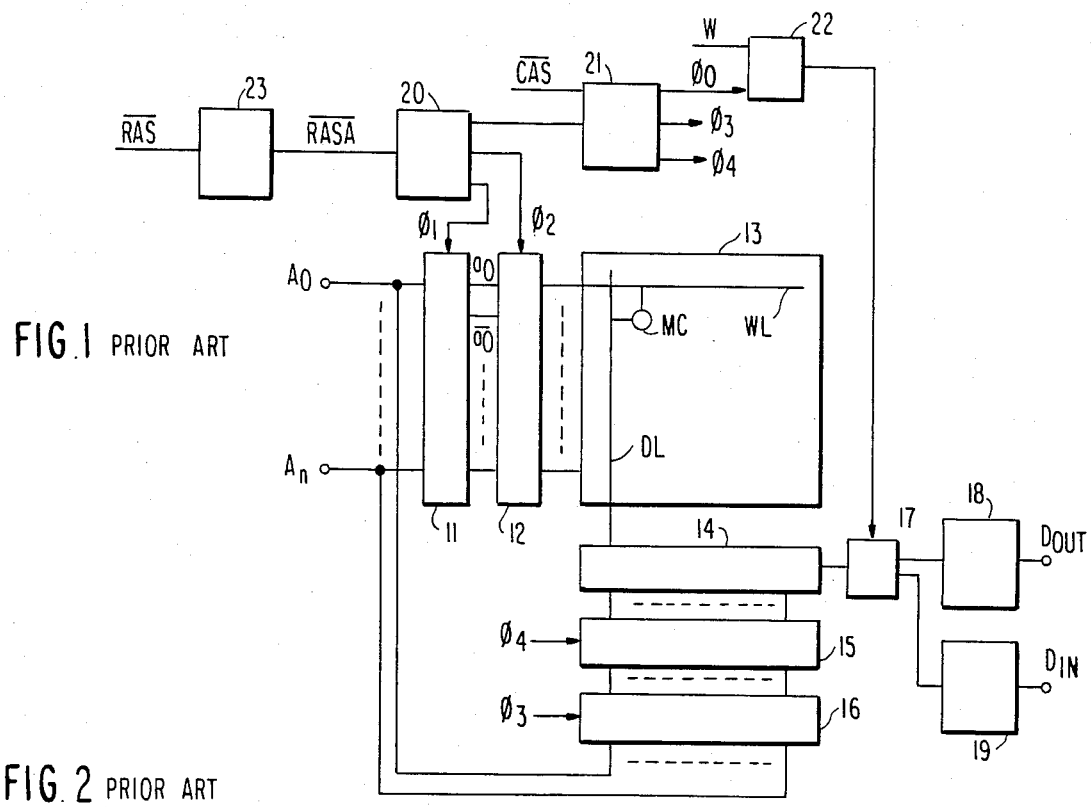
FIG. 1 is a schematic block diagram showing a dynamic memory.

With reference to FIG. 1, the general structure of a dynamic memory will be briefly explained.

The memory is the so-called multi-strobe type in which row address signals and column address signals are incorporated through the same set of address input terminals Ta to An in response to a row strobe signal $\overline{RAS}$ and a column strobe signal $\overline{CAS}$ in a time divisional way. A buffer 23 receives $\overline{RAS}$ and generates an internal signal $\overline{RASA}$. In response to $\overline{RASA}$, a timing signal generator 20 generates timing signals $\phi_1$ and $\phi_2$ in a predetermined sequence. Namely, in response to a high level of $\overline{RASA}$, the generator 20 produces the signal $\phi_1$ first which controls a reset operation of the address buffer 11, and then produces the signal $\phi_2$ for precharging the decoder 12 which is connected to word lines WL of a memory cell array 13. The array includes a plurality of memory cells MC at intersections of the word lines WL and digit lines DL in a known manner. A column timing signal generator 21 receives $\overline{CAS}$ and an output signal of the timing signal generator 20 and generates timing signals $\phi_3$ and $\phi_4$ for controlling reset operations of a column address buffer 16 and a column decoder 15, respectively, and also generates a signal $\phi_c$ for controlling a read-write control signal generator 22. The generator 22 controls a switch circuit 17 which selectively connects a data output circuit 18 and a data input circuit 19 to a column selection circuit 14.

In this memory, the signal $\overline{RASA}$ serves as a basic timing signal to control the whole memory directly and indirectly. The operations based on $\overline{RASA}$ will be explained hereinbelow.

Figure 2:
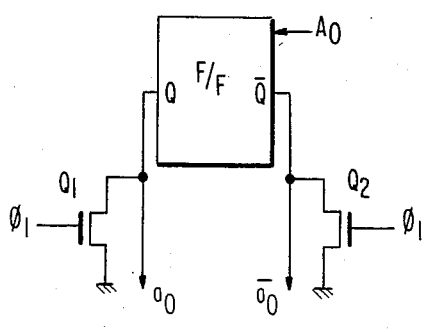
FIG. 2 is a schematic circuit diagram showing a 1-bit unit of an address buffer.

FIG. 2 shows a one bit structure of the buffer 11. A flip-flop F/F receives the address input Ao and generates its true signal ao and complementary signal $\overline{ao}$. Here, transistors $Q_1$ and $Q_2$ are connected between the outputs ao, $\overline{ao}$ and a ground potential, respectively. The transistors $Q_1$ and $Q_2$ operatively clamp the outputs ao and $\overline{ao}$ to the ground potential in response to the timing signal $\phi_1$ for resetting.

Figure 3:
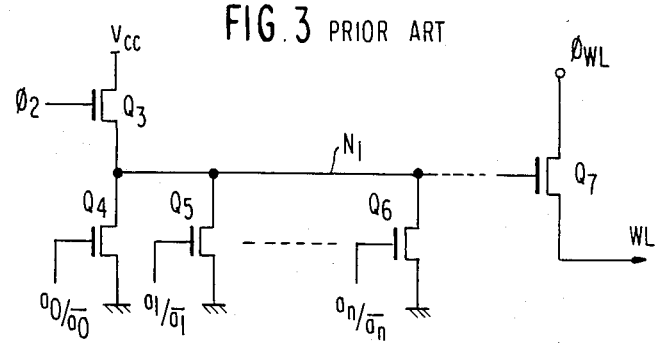
FIG. 3 is a schematic circuit diagram showing a 1-bit structure of the address decoder.

FIG. 3 shows a one bit structure of the decoder 12. The decoder is basically composed of a NOR circuit including transistors $Q_4$, $Q_5$, $Q_6$ receiving the outputs from the buffer 11 in a predetermined combination, a precharge transistor $Q_3$ and a word line drive transistor $Q_7$. Here, the time relation between the signal $\phi_1$ and the signal $\phi_2$ is determined such that the signal $\phi_2$ will be at the high potential level after the reset signal $\phi_1$ is at the high potential. If the signal $\phi_2$ is at the high potential when the reset signal $\phi_1$ is at the low potential, at least one of the OR transistors $Q_4$, $Q_5$, $Q_6$ conducts because one of the outputs $a_i$ or $\overline{a_i}$ is necessarily at the high potential. In this circumstance, it sometimes happens that when the signal $\phi_2$ is produced, a large quantity of current flows through the address decoder so that a protection circuit of the power source is switched and the operation of the DRAM is stopped.

Figure 4:
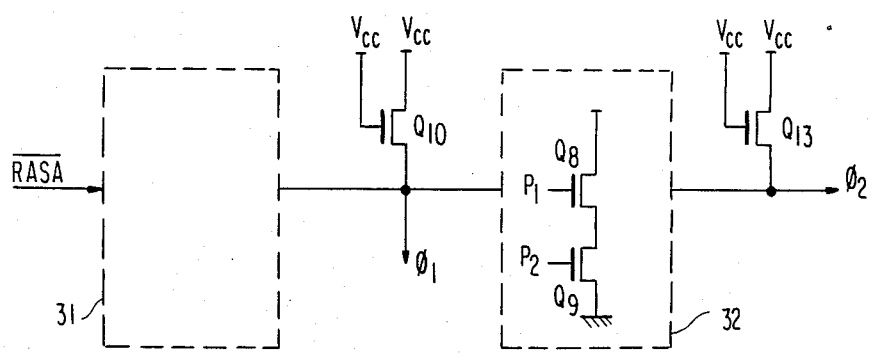
FIG. 4 is a schematic diagram of a timing signal generator according to the prior art.

FIG. 4 is a block diagram of a part of the conventional timing signal generator 20 in the DRAM. Delay circuits 31 and 32 are composed of dynamic logic circuits. The delay circuit 31 generates the signal $\phi_1$ with a time lag of $T_1$ with respect to the input signal $\overline{RASA}$, and the delay circuit 32 generates the signal $\phi_2$ with a time lag of $T_2$ with respect to the signal $\phi_1$. Transistors $Q_{10}$ and $Q_{11}$ are pull-up transistors for initializing the states of $\phi_1$ and $\phi_2$.

The current capacity of transistors $Q_8$ and $Q_9$ is made about 100 times that of the $Q_{13}$. In the quiescent state, signals $P_1$ and $P_2$ are complementary to each other so that one of the transistors $Q_8$ and $Q_9$ conducts while the other is cut off. Therefore, in the quiescent state the level of the signal $\phi_2$ is dependent on the signals $P_1$ and $P_2$, which are, in turn, determined solely by the signal $\phi_1$.

At the time of turning on the power voltage, however, the level of the signal $\overline{RASA}$ is uncertain and may be either high or low level and the levels of the signals $P_1$ and $P_2$ are indefinite. Therefore, the signals $\phi_1$ and $\phi_2$ are set comparatively slowly to a high level by the pull-up transistors $Q_{10}$ and $Q_{13}$. Since the gates of the pull-up transistors $Q_{10}$ and $Q_{13}$ are conncted to the terminals of the power source, the characteristics of the transistors $Q_{10}$ and $Q_{13}$ and their loads determine which one of the signals $\phi_1$ and $\phi_2$ will rise first in potential when the power voltage is switched on. However, to accurately obtain the necessary manufacturing characteristics relative to the pull-up transistors $Q_{10}$ and $Q_{13}$, particularly current capacity, and to conveniently determine the load, are extremely difficult if not impossible. Therefore, an abnormality in timing between the signals may occur with the effect that the signal $\phi_2$ may become high earlier than the signal $\phi_1$. As described above, this timing abnormality disadvantageously leads to excessive current supply.

Figure 5:
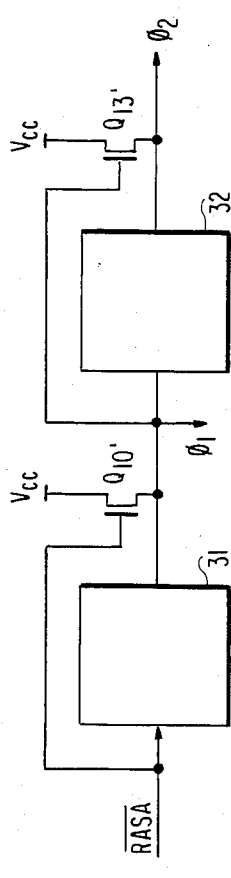
FIG. 5 is a schematic diagram showing a timing signal generator according to the present invention.

An embodiment of the invention will now be described with reference to FIG. 5. According to the invention, the gate of the transistor $Q_{10'}$, which is analogous to transistor $Q_{10}$ of FIG. 4, is connected to receive the signal $\overline{RASA}$ and the gate of the transistor $Q_{13'}$, which is analogous to the transistor $Q_{13}$ of FIG. 4, is connected to the output ($\phi_1$) of the delay circuit 31. Here, $\overline{RASA}$ is the signal which takes a high level during at least a part of the stand-by period after the power is switched on.

Therefore, the signal $\phi_1$ rises in potential first in response to a high level of $\overline{RASA}$ applied to the delay circuit 31 and gate of transistor $Q_{10'}$. Then, in response to the rise of $\phi_1$, the transistor $Q_{13'}$ becomes conducting to raise $\phi_2$ to a high level directly after the power is switched on. In this instance, the states of the delay circuits 31 and 32 are unstable and cannot properly drive their outputs.

Accordingly, the transistor $Q_{13}$, never conducts unless the reset signal $\phi_1$ assumes the high level. Consequently, when initializing immediately after turning on the power, the order of the generation of signals, in which after the signal $\phi_1$ becomes high level, the signal $\phi_2$ should become high level, is steadily preserved.

Figure 6:
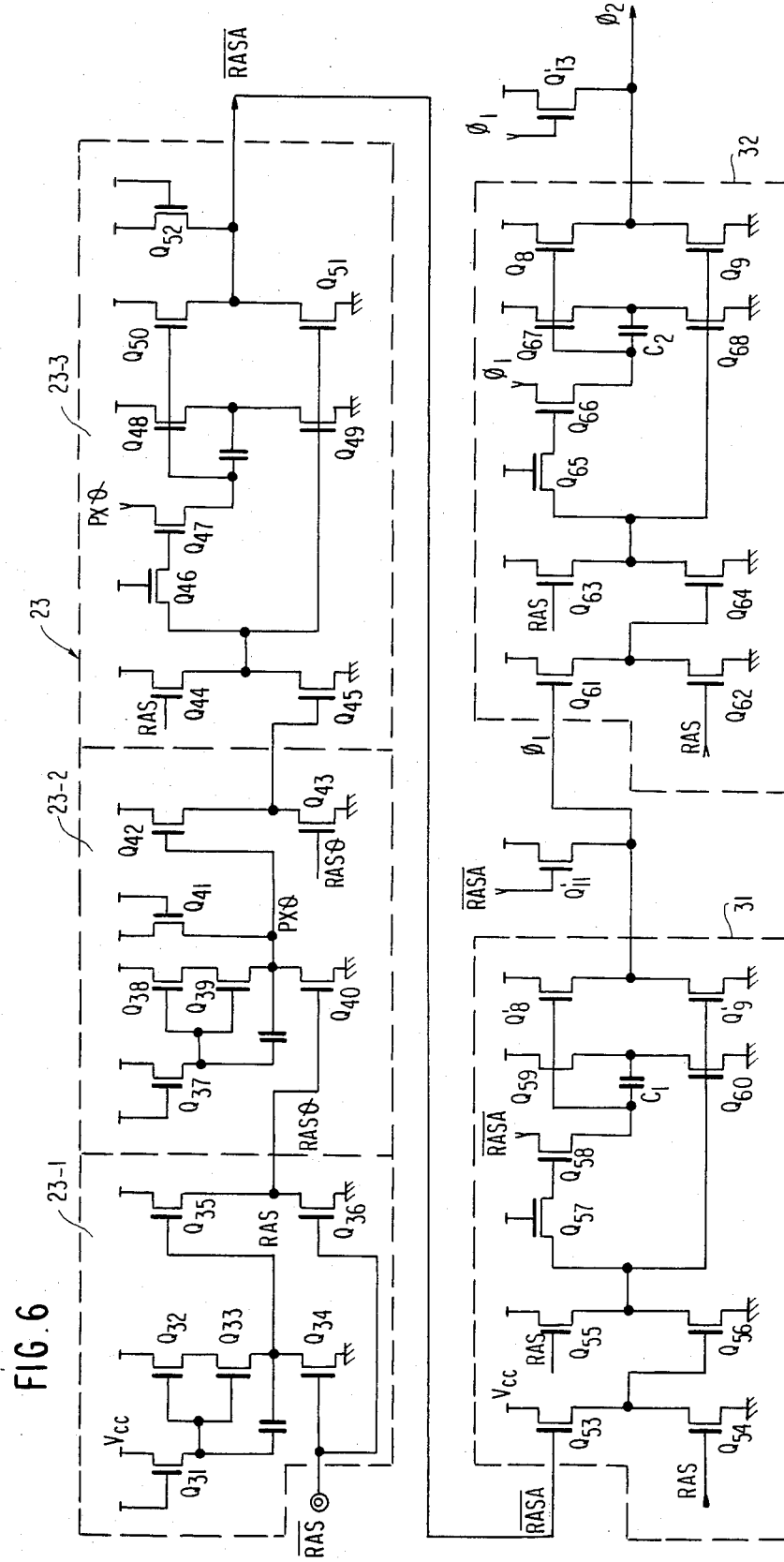
FIG. 6 is a schematic circuit diagram showing a detailed example of the timing signal generator according to the present invention.

With reference to FIG. 6, a detailed example of the timing signal generator of the invention will be explained with a detailed example of the buffer 23 of FIG. 1.

The buffer 23 is composed of three stages of inverters 23-1 to 23-3 connected in cascade. The inverter stage 23-1 generates RAS and RASO having the opposite phase to $\overline{RAS}$. The stage 23-2 generates PXO of the opposite phase to RASO in response to RASO and the stage 23-3 generates $\overline{RASA}$.

The delay circuit 31 is made of transistors $Q_{53}$ through $Q_{60}$, $Q_8$ and $Q_9$ in which $Q_8$ and $Q_9$ form a push-pull type output section. The delay circuit 32 has a structure similar to that of the circuit 31.

Next, operations of the circuit of FIG. 6 will be explained with reference to FIGS. 7A and 7B for the cases where $\overline{RAS}$ is at a high level and a low level when the power voltage is switched on, respectively.

Figure 7A:
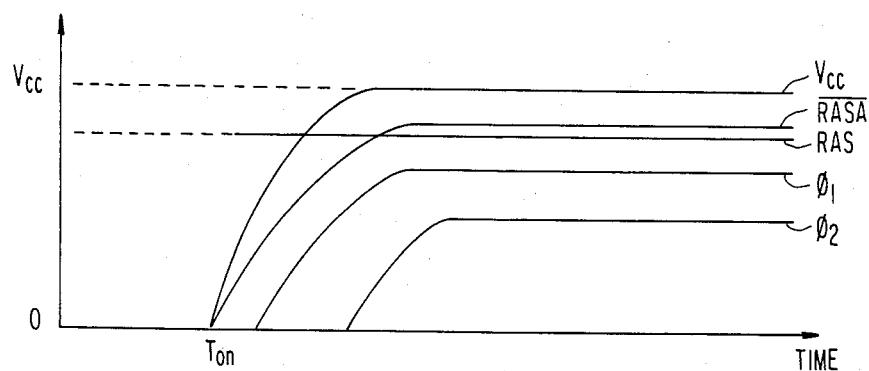
FIGS. 7A and 7B show waveform diagrams which illustrate the operation of the circuit of FIG. 6.

With reference to FIG. 7A, the operation when $\overline{RAS}$ is at a high level will be explained.

The power voltage is switched on at Ton. RAS and RASO generated from the stage 23-1 are at a low level because the transistors $Q_{34}$ and $Q_{36}$ are conducting, and hence PXO and $\overline{RASA}$ rise in potential in proportion of the rise of the power voltage $V_{cc}$ through the pull-up transistors $Q_{44}$ and $Q_{52}$. Since $\overline{RASA}$ is high and RAS is low, the gas of the transistor $Q'_8$ of the delay circuit 31 becomes low. Although $\overline{RASA}$ is at a high level, a boot capacitor $C_1$ does not store any charge in this instance, and therefore, the gate potential of $Q'_8$ is at a low level. Accordingly, the transistors $Q'_8$ and $Q'_9$ are non-conducting so that the output of the delay circuit 31 is in a floating state unless the transistor $Q'_{11}$ is present. But, in this instance, the transistor $Q'_{11}$ is conducting in response to a high level of $\overline{RASA}$ applied to its gate so that the signal $\phi_1$ gradually rises along with RASA.

In the delay circuit 32, the gate potentials of the transistors $Q_8$ and $Q_9$ are at a low level. After $\phi_1$ becomes high, $\phi_2$ rises gradually through the transistor $Q_{13'}$. Thus, the order in which $\phi_1$ and $\phi_2$ rise is established.

Figure 7B:
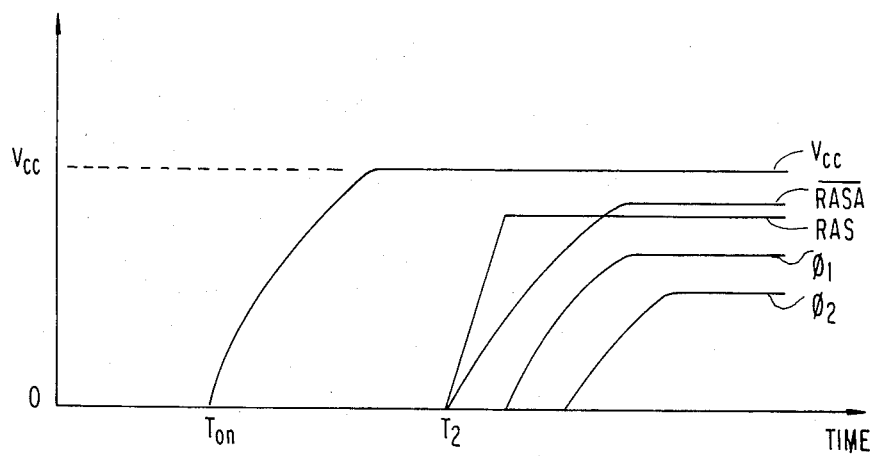

With reference to FIG. 7B, the operation when $\overline{RAS}$ is at a low level when the power is switched on will be explained. After the power voltage is switched on at a time point Ton, RAS and RASO rise in proportion to the rise of $V_{cc}$ while PXO and $\overline{RASA}$ becomes low because the transistors $Q_{40}$, $Q_{43}$, $Q_{44}$, $Q_{49}$ and $Q_{51}$ become conducting. Here, the drivability of the pull-up transistors $Q_{44}$ and $Q_{52}$ are very small as compared to those of $Q_{40}$, $Q_{50}$ and $Q_{51}$. In this instance, the transistor $Q_{55}$ is conducting in response to a high level of RAS and the transistors $Q_{60}$ and $Q_9$ become conducting so that the $\phi_1$ is kept at a low level irrespective of $Q'_{11}$. Also, in the delay circuit 32, the transistors $Q_{63}$, $Q_{68}$ and $Q_9$ become conducting so that $\phi_2$ is set low.

As long as RAS is at a high level, the memory cannot introduce the access operation. Therefore, $\overline{RAS}$ is changed from a low level to a high level at a time point $T_2$. Then, RAS and RASO become low while PXO and $\overline{RASA}$ become high. With $\overline{RASA}$ high, the transistors $Q_{53}$ and $Q_{50}$ conduct so that the gate protentials of $Q_{60}$ and $Q'_9$ are kept at a low level and also the gate potential of $Q_{58}$ is kept at a low level. Consequently, the transistors $Q'_8$ and $Q'_9$ become non-conducting so that $\phi_1$ starts to rise through the transistor $Q'_{11}$.

While the delay circuit 32, after $\phi_1$ becomes high, the gate potentials of $Q_{66}$, $Q_{68}$ and $Q_9$ are at a low level because the transistor $Q_{64}$ is conducting. Consequently, the transistors $Q_{67}$, $Q_{68}$, $Q_8$ and $Q_9$ become non-conducting and the delay circuit 32 itself does not drive the signal $\phi_2$. In response to the rise of $\phi_1$, the transistor $Q'_{13}$ becomes conducting so that $\phi_2$ starts to rise in potential.

As described above, the timing signal generator of the invention can generate a plurality of timing signal in a desired order when the power voltage is switched on.

While the invention has been described in detail and with reference to specific embodiments thereof, it will be apparent to one skilled in the art that various changes and modifications can be made therein without departing from the spirit and scope thereof.

What is claimed is:

1. In a timing signal generator of the type having a first dynamic delay circuit adapted to generate a first delay signal in response to a control signal applied to an input terminal thereof, and a second dynamic delay circuit adapted to generate a second delay signal in response to said first delay signal, said first and second dynamic delay circuits sequentially generating said first and second delay signals respectively under the condition of a steady supply of power thereto, said first and second delay signals being generated in a random order when the supply of power is initiated, the improvement comprising a first field effect transistor coupled between the output terminal of said first dynamic delay circuit and a first voltage terminal and having a gate coupled to the input terminal of said first dynamic delay circuit and a second field effect transistor coupled between the output terminal of said second dynamic delay circuit and said first voltage terminal and having a gate coupled to said output terminal of said first dynamic delay circuit, whereby when the supply of power is initiated, the output terminal of said first dynamic delay circuit first generates said first delay signal in response to the control signal at said input terminal thereof and thereafter the output terminal of said second dynamic delay circuit generates said second delay signal.

2. The invention as claimed in claim 1, wherein said first delay circuit includes a series circuit of third and fourth field effect transistors connected between said first voltage terminal and a second voltage terminal and control means responsive to said input signal for controlling said third and fourth transistors in a complementary manner.

3. The invention as claimed in claim 2, wherein driving ability of said first transistors is smaller than those of said third and fourth transistors.

4. The invention as claimed in claim 2, wherein said second delay circuit includes a series circuit of fifth and sixth field effect transistors connected between said first and second voltage terminals and control means responsive to said first delay signal for controlling said fifth and sixth transistors in a complementary manner.

5. The invention as claimed in claim 4, wherein driving ability of said second transistor is smaller than those of said fifth and sixth transistors.

6. The invention as claimed in claim 1, further including a dynamic memory incorporating said timing signal generator.

7. The invention as claimed in claim 5, wherein said control means includes a buffer circuit responsive to an external signal, said buffer including a seventh field effect transistor coupled between the output terminal thereof and said first voltage terminal and having a gate connected to said second voltage terminal.

8. A timing signal generator comprising a buffer circuit receiving a first control signal to generate a second control signal, said buffer circuit generating said second control signal when a power supply is switched on irrespective of the presence of said first control signal, a first dynamic delay circuit for generating a first timing signal in response to said second control signal a first field effect transistor coupled between said power supply and the output terminal of said first dynamic delay circuit and having a gate adapted to receive said second control signal, a second delay circuit for operatively generating a second delay signal in response to said first delay signal, and a second field effect transistor coupled between said power supply and the ouput terminal of said second dynamic delay circuit and having a gate adapted to receive said first delay signal to thereby present said second dynamic delay circuit from generating said second delay signal before generation of said first delay signals.

9. The generator according to claim 8, wherein said buffer circuit includes a third field effect transistor coupled between said power supply and the output terminal of said buffer circuit.

10. The generator according to claim 9, wherein said first delay circuit includes a series circuit of fourth and fifth field effect transistors connected between said power supply and a ground potential and first control means responsive to said second control signal for controlling said fourth and fifth transistors in a complementary manner.

11. The generator according to claim 10, wherein driving ability of said first transistor is smaller than those of said fourth and fifth transistors.

12. A timing signal generator comprising a buffer circuit receiving a first control signal to generate a second control signal, said buffer circuit generating said second control signal when a power supply is switched on irrespective of the presence of said first control signal, a first delay circuit for generating a first timing signal in response to said second control signal, a first field effect transistor coupled between said power supply and the output terminal of said first delay circuit for having a gate adapted to receive said second control signal, a second delay circuit for operatively generating a second delay signal in response to said first delay signal, and a second field effect transistor coupled between said power supply and the output terminal of said second delay circuit and having a gate adapted to receive said first delay signal, said buffer circuit including a third field effect transistor coupled between said power supply and the output terminal of said buffer circuit, said first delay circuit including a series circuit of fourth and fifth field effect transistors connected between said power supply and a ground potential and first control means responsive to said second control signal for controlling said fourth and fifth transistors in a complementary manner, and said second delay circuit including a series circuit of sixth and seventh field effect transistors coupled between said power supply and the ground potential and second control means responsive to said first delay signal for controlling said sixth and seventh transistors in a complementary manner.

13. The generator according to claim 12, wherein driving ability of said second transistor is smaller than those of said sixth and seventh transistors.

14. A timing signal generator comprising a first dynamic type delay circuit receiving a control signal and generating a first delay signal at its output terminal, the output terminal of said first dynamic type delay circuit taking a floating state when a power supply is switched on under a condition that said control signal is in one of two binary logic levels and when said control signal changes from the other of said binary logic levels to said one logic level immediately after said power supply is switched on, a first field effect transistor connected between the output terminal of said first dynamic type delay circuit and a first voltage terminal and having a gate supplied with said control signal, said first field effect transistor being turned on by said one logic level of said control signal to change the potential of the output terminal of said first dynamic type delay circuit when taking the floating state to take said one logic level, a second dynamic type delay circuit receiving said first delay signal and generating a second delay signal at its output terminal, the output terminal of said second dynamic type delay circuit taking a floating state when said power supply is switched on under a condition that said first delay signal is in said one logic level and when said first delay signal changes from said other logic level to said one logic level immediately after said power supply is switched on, and a second field effect transistor connected between the output terminal of said second dynamic type delay circuit and said first voltage terminal and a gate supplied with said first delay signal, and second field effect transistor being turned on by said one logic level of said first delay signal thereby to change the potential of the output terminal of said dynamic type delay circuit when taking the floating state to take said one logic level after said first delay signal takes said one logic level.

15. A timing signal generator comprising a buffer circuit receiving a first control signal and generating a second control signal taking its logic level responsive to a logic level of said first control signal; a first delay circuit generating at a first output terminal a first timing signal in response to said second control signal, said first delay circuit including a first field effect transistor connected between said first output terminal and a first potential terminal, a second field effect transistor connected between said first output terminal and a second potential terminal, and first control means responsive to said second control signal for controlling said first and second field effect transistors in a complementary manner, said first and second field effect transistors being in a non-conducting state when a power supply is switched on to supply a power voltage between said first and second potential terminal under a condition that said second control signal is in one of two binary logic levels; a third field effect transistor connected between said first output terminal and said first potential terminal and supplied with said second control signal, said third field effect transistor being turned on in response to said one logic level of said second control signal; a second delay circuit generating at a second output terminal a second timing signal in response to said first timing signal, said second delay circuit including a fourth field effect transistor connected between said second output terminal and said first potential terminal, a fifth field effect transistor connected between said second output terminal and said second potential terminal, and second control means responsive to said first timing signal for controlling said fourth and fifth field effect transistors in a complementary manner, said fourth and fifth field effect transistors being in a non-conducting state when said power supply is switched on under a condition that said first timing signal is in said one logic level; and a sixth field effect transistor connected between said second output terminal and said first potential terminal and supplied with said first timing signal, said sixth field effect transistor being turned on in response to said one logic level of said first timing signal, whereby said third field effect transistor raises said first timing signal to said one logic level irrespective of the non-conducting state of said first and second field effect transistors and said sixth field effect transistors raises said second timing signal to said one logic level irrespective of the non-conducting state of said fourth and fifth transistors after said first timing signal takes said one logic level.

16. The generator as claimed in claim 15, wherein driving ability of said third transistor is smaller than those of said first and second transistors and driving ability of said sixth transistor is smaller than those of said fourth and fifth transistor.

17. A timing signal generator comprising first and second power supply terminals; a first circuit receiving a control signal and generating a first timing signal at a first output terminal, said first circuit including first, second and third nodes, a first transistor connected between said first power supply terminal and said first output terminal and having a gate connected to said first node, a second transistor connected between said first output terminal and said second power supply terminal and having a gate connected to said second node, a third transistor connected between said power supply terminal and said third node and having a gate connected to said second node, a fouth transistor connected between said third node and said second power supply terminal and having a gate connected to said second node, a first capacitor connected between said first and third nodes, means for supplying said control signal to said first node, means for inverting said control signal, and means for supplying the inverted control signal to said second node; a fifth transistor connected between said first power supply terminal and said first output terminal; means for supplying said control signal to a gate of said fifth transistor; a second circuit receiving said first timing signal and generating a second timing signal at a second output terminal, said second circuit including fourth, fifth and sixth nodes, a sixth transistor connected between said first power supply terminal and said second output terminal and having a gate connected to said fourth node, a seventh transistor connected between said second output terminal and said second power supply terminal and having a gate connected to said fifth node, an eighth transistor connected between said first power supply terminal and said sixth node and having a gate connected to said fourth node, a ninth transistor connected between said sixth node and said second power supply terminal and having a gate connected to said fifth node, a second capacitor connected between said fourth and sixth nodes, means for supplying said first timing signal to said fourth node, means for inverting said first timing signal, and means for supplying the inverted first timing signal to said fifth node; a tenth transistor connected between said first power supply terminal and said second output terminal; and means for supplying said first timing signal to a gate of said tenth transistor; whereby said first timing signal is generated before said second timing signal in response to a switch-on of a power supply.

* * * * *

UNITED STATES PATENT AND TRADEMARK OFFICE
CERTIFICATE OF CORRECTION

PATENT NO. : 4,641,049

DATED : February 3, 1987

INVENTOR(S) : Y. FUKUZO

It is certified that error appears in the above-identified patent and that said Letters Patent is hereby corrected as shown below:

Column 3, line 34, delete "OR" and insert --NOR--;

Column 4, line 61, delete "gas" and insert --gate--;

Column 5, line 2, delete "RASA" and insert --$\overline{\text{RASA}}$--;

Column 8, line 61, delete "said power" and insert --said first power--

Signed and Sealed this

First Day of March, 1988

*Attest:*

DONALD J. QUIGG

*Attesting Officer*   *Commissioner of Patents and Trademarks*